United States Patent
Nasu et al.

(10) Patent No.: US 9,644,266 B2
(45) Date of Patent: May 9, 2017

(54) FILM FORMING APPARATUS, GAS SUPPLY DEVICE AND FILM FORMING METHOD

(71) Applicant: TOKYO ELECTRON LIMITED, Tokyo (JP)

(72) Inventors: Masayuki Nasu, Nirasaki (JP); Masaki Sano, Nirasaki (JP); Yu Nunoshige, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 131 days.

(21) Appl. No.: 14/223,582

(22) Filed: Mar. 24, 2014

(65) Prior Publication Data
US 2014/0295083 A1 Oct. 2, 2014

(30) Foreign Application Priority Data

Mar. 29, 2013 (JP) ................................. 2013-074617

(51) Int. Cl.
C23C 16/44 (2006.01)
H01J 37/32 (2006.01)

(52) U.S. Cl.
CPC ...... *C23C 16/4408* (2013.01); *H01J 37/3244* (2013.01); *H01J 37/32862* (2013.01); *Y10T 137/4245* (2015.04)

(58) Field of Classification Search
CPC .............. C23C 16/4408; H01J 37/3244; H01J 37/32862; Y10T 137/4245
USPC ....................................... 118/715; 156/345.1
See application file for complete search history.

(56) References Cited

U.S. PATENT DOCUMENTS

| 5,453,124 A * | 9/1995 | Moslehi ............ C23C 16/45561 118/715 |
| 5,865,205 A * | 2/1999 | Wilmer ................ G05D 7/0635 137/2 |
| 6,025,013 A * | 2/2000 | Heming ................ C23C 16/455 427/162 |
| 6,228,773 B1 * | 5/2001 | Cox .................. H01L 21/67017 118/719 |

(Continued)

FOREIGN PATENT DOCUMENTS

| JP | 6-45256 A | 2/1994 |
| JP | 2006-253629 A | 9/2006 |

(Continued)

*Primary Examiner* — Rudy Zervigon
(74) *Attorney, Agent, or Firm* — Nath, Goldberg & Meyer; Jerald L. Meyer

(57) ABSTRACT

There is provided a film forming apparatus including gas supply paths, retaining units, valves, a purge gas supply unit and a control unit. The control unit is configured to implements a film forming process for sequentially performing operations of actuating the valves such that reaction gases are retained in the retaining units, the internal pressures of the retaining units are increased and then the reaction gases are supplied from the retaining units into the process chamber, and a purging process for subsequently repeating, a plurality number of times, operations of actuating the valves such that the purge gas is retained in the retaining units, the internal pressures of the retaining units are increased to a pressure higher than the internal pressures of the retaining units which is increased in the film forming process, and then the purge gas is supplied from the retaining units into the process chamber.

5 Claims, 10 Drawing Sheets

(56) References Cited

U.S. PATENT DOCUMENTS

| | | | | |
|---|---|---|---|---|
| 6,296,711 B1* | 10/2001 | Loan | C23C 16/44 | 118/50 |
| 6,305,314 B1* | 10/2001 | Sneh | C23C 16/44 | 118/723 E |
| 6,451,119 B2* | 9/2002 | Sneh | C23C 16/44 | 118/715 |
| 6,508,913 B2* | 1/2003 | McMillin | C23F 4/00 | 118/715 |
| 6,540,838 B2* | 4/2003 | Sneh | C23C 8/00 | 118/715 |
| 6,631,334 B2* | 10/2003 | Grosshart | G05D 7/0635 | 118/726 |
| 6,652,655 B1* | 11/2003 | Ho | C23C 16/46 | 118/725 |
| 7,109,131 B2* | 9/2006 | Herring | H01L 21/28247 | 118/663 |
| 7,615,120 B2* | 11/2009 | Shajii | C23C 16/45527 | 118/663 |
| 7,674,393 B2* | 3/2010 | Tahara | H01J 37/32935 | 156/345.24 |
| 7,708,859 B2* | 5/2010 | Huang | C23C 16/45561 | 118/715 |
| 8,257,602 B2* | 9/2012 | Lebouitz | H01L 21/3065 | 216/59 |
| 8,397,668 B2* | 3/2013 | Kobayashi | H01J 37/32082 | 118/715 |
| 8,997,686 B2* | 4/2015 | Ding | C23C 16/448 | 118/695 |
| 9,127,358 B2* | 9/2015 | Inoue | C23C 16/4481 | |
| 9,348,339 B2* | 5/2016 | Ding | G05D 7/0635 | |
| 2001/0016364 A1* | 8/2001 | Loan | C23C 16/44 | 438/14 |
| 2003/0070617 A1* | 4/2003 | Kim | C23C 16/34 | 118/715 |
| 2003/0183171 A1* | 10/2003 | Sneh | C23C 8/00 | 118/724 |
| 2003/0221779 A1* | 12/2003 | Okuda | C23C 16/4405 | 156/345.26 |
| 2004/0244837 A1* | 12/2004 | Nawata | G05D 7/0635 | 137/487.5 |
| 2004/0261703 A1* | 12/2004 | Kobrin | B05D 1/60 | 118/715 |
| 2005/0223979 A1* | 10/2005 | Shajii | C23C 16/45527 | 118/692 |
| 2005/0249876 A1* | 11/2005 | Kawahara | C23C 16/45514 | 427/255.34 |
| 2006/0016559 A1* | 1/2006 | Kobayashi | H01J 37/32082 | 156/345.34 |
| 2006/0042754 A1* | 3/2006 | Yoshida | H01J 37/32091 | 156/345.1 |
| 2006/0160359 A1* | 7/2006 | Kasai | C23C 16/455 | 438/680 |
| 2006/0169671 A1* | 8/2006 | Miya | H01J 37/3244 | 216/67 |
| 2006/0201425 A1* | 9/2006 | Kobrin | C23C 16/4402 | 118/715 |
| 2006/0213441 A1* | 9/2006 | Kobrin | B05D 1/60 | 118/715 |
| 2006/0231204 A1* | 10/2006 | Elliott | B08B 7/0042 | 156/345.5 |
| 2007/0175391 A1* | 8/2007 | Mizusawa | C23C 16/455 | 118/689 |
| 2007/0181255 A1* | 8/2007 | Hayasaka | C23C 16/455 | 156/345.33 |
| 2007/0247075 A1* | 10/2007 | Kim | H01J 37/321 | 315/111.21 |
| 2007/0249173 A1* | 10/2007 | Kim | H01J 37/32091 | 438/711 |
| 2007/0251642 A1* | 11/2007 | Bera | H01J 37/32082 | 156/345.26 |
| 2007/0251917 A1* | 11/2007 | Bera | H01J 37/321 | 216/58 |
| 2007/0251918 A1* | 11/2007 | Bera | H01J 37/321 | 216/58 |
| 2007/0254483 A1* | 11/2007 | Bera | H01J 37/3244 | 438/689 |
| 2007/0254486 A1* | 11/2007 | Bera | H01J 37/32091 | 438/706 |
| 2008/0248595 A1* | 10/2008 | Matsumoto | C23C 16/0272 | 438/3 |
| 2009/0095423 A1* | 4/2009 | Miya | H01J 37/3244 | 156/345.33 |
| 2009/0117746 A1* | 5/2009 | Masuda | C23C 16/45561 | 438/710 |
| 2009/0117752 A1* | 5/2009 | Ozaki | C23C 16/4408 | 438/795 |
| 2009/0205567 A1* | 8/2009 | Noda | C23C 16/24 | 118/668 |
| 2009/0269494 A1* | 10/2009 | Takahashi | C23C 16/401 | 427/255.28 |
| 2010/0144145 A1* | 6/2010 | Takahata | C23C 16/52 | 438/680 |
| 2010/0247763 A1* | 9/2010 | Coutu | C23C 16/4401 | 427/248.1 |
| 2010/0322604 A1* | 12/2010 | Fondurulia | C23C 16/4481 | 392/451 |
| 2012/0073672 A1* | 3/2012 | Ding | C23C 16/448 | 137/14 |
| 2012/0076935 A1* | 3/2012 | Ding | G05D 7/0635 | 427/248.1 |
| 2013/0247651 A1* | 9/2013 | Grange | C23C 14/243 | 73/40.5 R |
| 2013/0312663 A1* | 11/2013 | Khosla | C23C 16/4485 | 118/710 |
| 2014/0024223 A1* | 1/2014 | Kilpi | C23C 16/403 | 438/758 |
| 2015/0086715 A1* | 3/2015 | Knaapen | C23C 16/4401 | 427/255.7 |
| 2016/0010210 A1* | 1/2016 | Yanai | C23C 16/45574 | 118/704 |

FOREIGN PATENT DOCUMENTS

| | | |
|---|---|---|
| JP | 2008-91625 A | 4/2008 |
| JP | 2008-277666 A | 11/2008 |
| JP | 2011-192931 A | 9/2011 |
| KR | 10-0375834 A | 10/2001 |
| KR | 10-2007-0012465 A | 1/2007 |

* cited by examiner

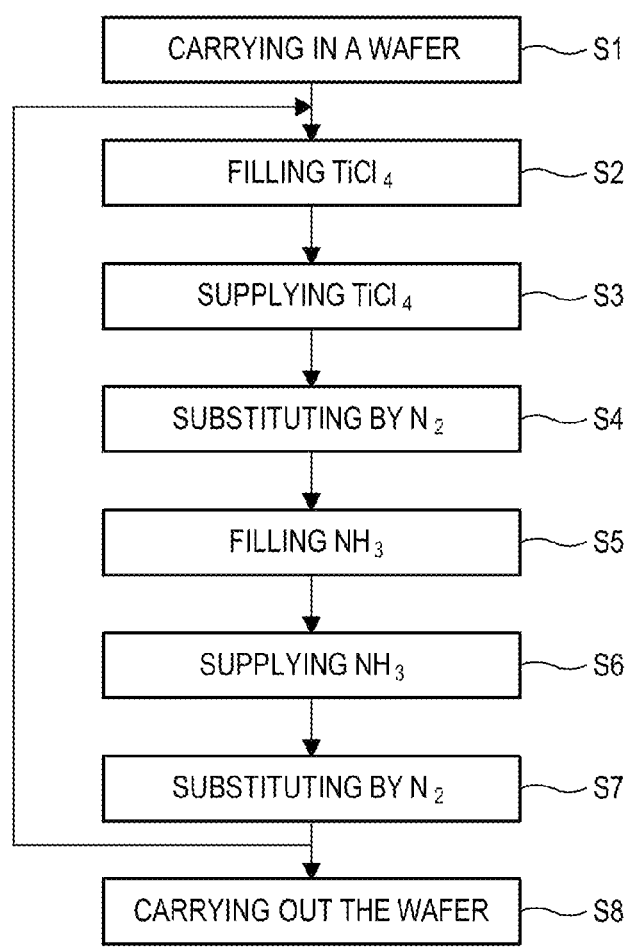

FILM FORMING APPARATUS, GAS SUPPLY DEVICE AND FILM FORMING METHOD

CROSS-REFERENCE TO RELATED APPLICATION

This application claims the benefit of Japanese Patent Application No. 2013-074617, filed on Mar. 29, 2013, in the Japan Patent Office, the disclosure of which is incorporated herein in its entirety by reference.

TECHNICAL FIELD

The present disclosure relates to a technical field in which a film is formed on a substrate using a reaction gas.

BACKGROUND

As a method of forming a film on a substrate, e.g., a semiconductor wafer (hereinafter referred to as a "wafer"), a method called an ALD (Atomic Layer Deposition) method and an MLD (Multi Layer Deposition) method (which will be collectively referred to as an ALD method) are conventionally used. The ALD method may provide a dense thin film and generally used for obtaining a good implantation property. In the ALD method, a specified film is formed by sequentially supplying different kinds of reaction gases reacting with one another to a wafer held within a process chamber.

In general, during a film-forming process, a film is deposited not only on a wafer but also on an inner wall of a process chamber. If the thickness of the deposited film grows larger, it causes the generation of particles. For that reason, a cleaning process is performed after films are formed on a predetermined number of wafers. The cleaning process is carried out by, e.g., supplying a highly-corrosive cleaning gas into the process chamber. The deposits adhering to the inner wall of the process chamber is detached from the inner wall when the deposits are contacted with the cleaning gas. While most of the detached components are removed by evacuating the interior of the process chamber, some of the detached components may sometimes remain within the process chamber. Thus, a purge gas is supplied into the process chamber and residues remaining within the process chamber are removed by conveying them out of the process chamber together with the flow of the purge gas.

After performing the cleaning process and the circulation of the purge gas, a wafer is carried into the process chamber and is subjected to a specified film-forming process. However, the particles may adhere to the wafer during the film forming process. Presumably, the reason is that the cleaning residues existing within the flow path of a deposition gas are supplied to the wafer together with the deposition gas along when the deposition gas circulates within the process chamber.

In respect of a particle reducing process, there is disclosed a related art in which an inert gas of a specified flow rate is introduced together with a reaction gas when processing a wafer and an inert gas of a large flow rate is introduced as a purge gas when performing a particle reducing process. In this related art, however, the flow path of the inert gas and the flow path of the reaction gas are independent of each other. Therefore, if the particles exist in the flow path of the reaction gas, it is likely that the particles adhere to the wafer when the reaction gas is supplied to the process chamber. There is also disclosed a related art in which, when an inspection item relating to a gas line connected to a process chamber is checked during the inspection of a semiconductor device, a purge gas is allowed to flow through the gas line at a maximum flow rate. In addition, there is disclosed a related art in which a gas is supplied in a pulse form by installing a pressure control tank in a gas supply pipe, installing a manometer in an exhaust pipe of the pressure control tank and controlling the internal pressure of the tank with the manometer to become a predetermined pressure.

There is disclosed a related art in which, when performing a film forming process, the internal pressure of a chamber is detected and the opening/closing operation of a valve is checked based on the detected internal pressure. There is also disclosed a related art in which a reaction gas tank provided with a manometer is installed in a flow path of a reaction gas and a plasma treatment is performed by supplying a reaction gas pre-filled in the reaction gas tank into the process chamber. In this method, if the volume of the process chamber is large, it is possible to rapidly supply the reaction gas such that the internal pressure of the chamber becomes a predetermined pressure. However, the related arts remain silent on a method of reducing particles by circulating a purge gas. It is therefore difficult for the related arts to solve the problems pointed out in the present disclosure.

SUMMARY

Some embodiments of the present disclosure provide a technology capable of reducing particle contamination of a substrate when a film is formed by sequentially supplying different kinds of mutually-reacting reaction gases to a substrate.

According to one embodiment of the present disclosure, there is provided a film forming apparatus for forming a thin film by sequentially supplying different kinds of mutually-reacting reaction gases to a substrate held within a process chamber of vacuum atmosphere and depositing reaction products on the substrate, the film forming apparatus including: gas supply paths formed in a corresponding relationship with the different kinds of the mutually-reacting reaction gases and configured to supply the mutually-reacting reaction gases into the process chamber; valves installed in the gas supply paths at upstream and downstream sides of the retaining units; a purge gas supply unit configured to supply a purge gas to the retaining units; retaining units installed in the gas supply paths, an internal pressures of the retaining units being increased by retaining at least one of the mutually-reacting reaction gases and the purge gas; and a control unit configured to implement: a film forming process for sequentially performing operations of actuating the valves such that the mutually-reacting reaction gases are retained in the retaining units, the internal pressures of the retaining units are increased and then the mutually-reacting reaction gases are supplied from the retaining units into the process chamber; and a purging process for subsequently repeating, a plurality number of times, operations of actuating the valves such that the purge gas is retained in the retaining units, the internal pressures of the retaining units are increased to a pressure higher than the internal pressures of the retaining units which is increased during the film forming process, and then the purge gas is supplied from the retaining units into the process chamber.

According to another embodiment of the present disclosure, there is provided a gas supply device used in a film forming apparatus for forming a thin film by sequentially supplying different kinds of mutually-reacting reaction gases to a substrate held within a process chamber of vacuum atmosphere and depositing reaction products on the substrate, the gas supply device including: gas supply paths formed in a corresponding relationship with the different kinds of the mutually-reacting reaction gases and configured to supply the mutually-reacting reaction gases into the process chamber; valves installed in the gas supply paths at upstream and downstream sides of the retaining units; a purge gas supply unit configured to supply a purge gas to the retaining units; retaining units installed in the gas supply paths, an internal pressures of the retaining units being increased by retaining at least one of the mutually-reacting reaction gases and the purge gas; and a control unit configured to implement: a film forming process for sequentially performing operations of actuating the valves such that the mutually-reacting reaction gases are retained in the retaining units, the internal pressures of the retaining units are increased and then the mutually-reacting reaction gases are supplied from the retaining units into the process chamber; and a purging process for subsequently repeating, a plurality number of times, operations of actuating the valves such that the purge gas is retained in the retaining units, the internal pressures of the retaining units are increased to a pressure higher than the internal pressures of the retaining units which is increased during the film forming process, and then the purge gas is supplied from the retaining units into the process chamber.

According to yet another embodiment of the present disclosure, there is provided a film forming method for forming a thin film by sequentially supplying different kinds of mutually-reacting reaction gases to a substrate held within a process chamber of vacuum atmosphere through gas supply paths installed in a corresponding relationship with the different kinds of the mutually-reacting reaction gases and depositing reaction products on the substrate, the method including: a film forming process for sequentially performing operations of retaining the mutually-reacting reaction gases in retaining units installed in the gas supply paths, increasing the internal pressures of the retaining units and then supplying the mutually-reacting reaction gases from the retaining units into the process chamber; and a purging process for subsequently repeating, a plurality number of times, operations of retaining the purge gas the retaining units, increasing the internal pressures of the retaining units to a pressure higher than the internal pressures of the retaining units which is increased during the film forming process and then supplying the purge gas from the retaining units into the process chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a flowchart illustrating one example of a film forming method implemented in the film forming apparatus.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A configuration of a film forming apparatus according to one embodiment of the present disclosure will now be described with reference to FIGS. 1 and 2. The present film forming apparatus is configured by an apparatus that forms a titanium nitride (TiN) film with an ALD method by alternately supplying a titanium chloride ($TiCl_4$) gas (a source gas) and an ammonia ($NH_3$) gas (a nitriding gas) as mutually-reacting reaction gases to a surface of a wafer W of, e.g., 300 mm in diameter.

Figure 1:
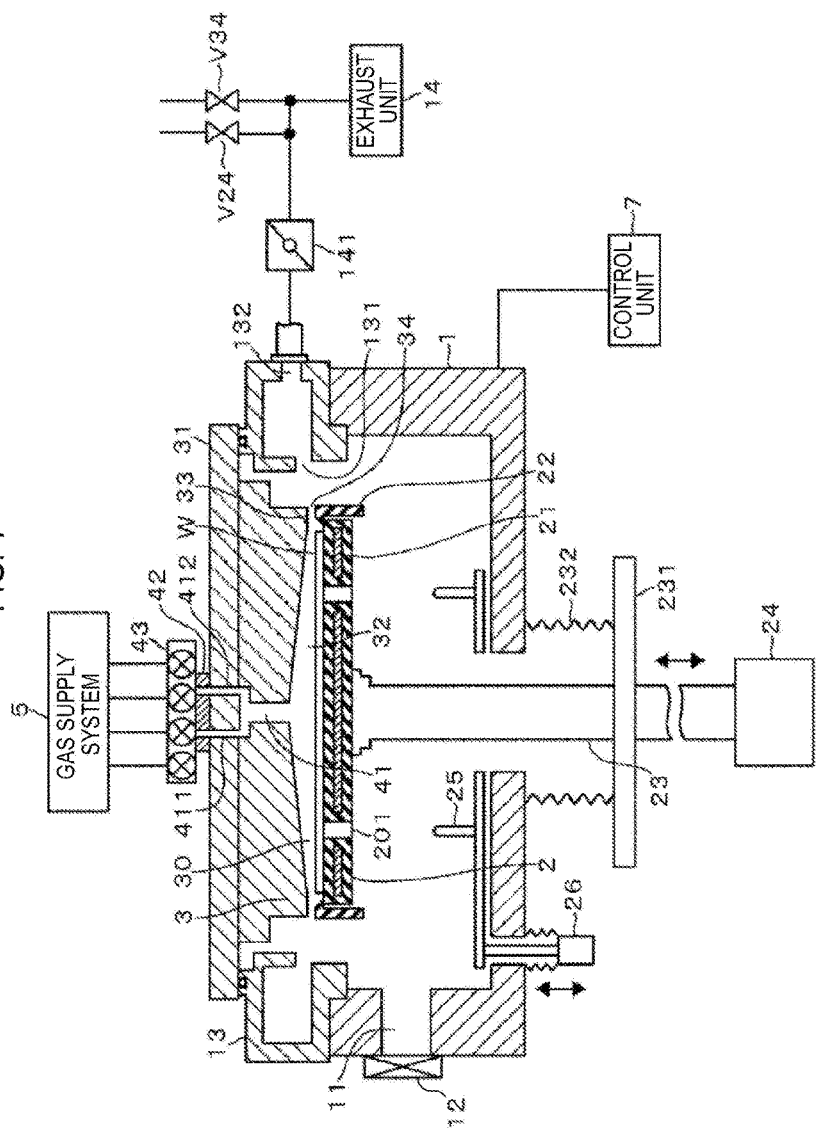
FIG. 1 is a vertical sectional view of a film forming apparatus according to the present disclosure.
Figure 2:
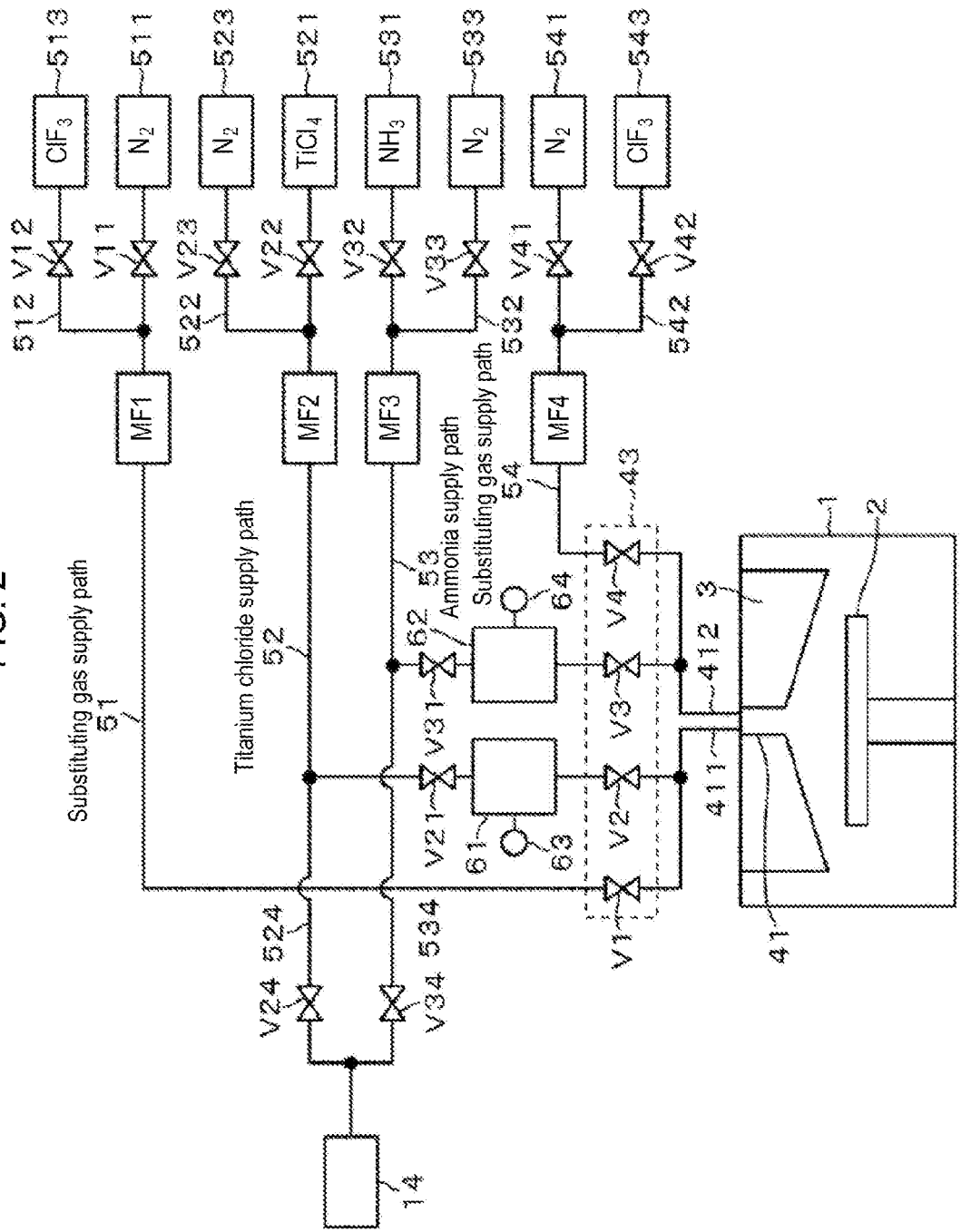
FIG. 2 is a configuration diagram showing a gas supply system of the film forming apparatus.

As shown in FIGS. 1 and 2, the film forming apparatus is provided with a processing vessel 1 including a vacuum container as a process chamber. A mounting table 2 for mounting a wafer W thereon is installed within the processing vessel 1. A ceiling plate member 3 is arranged so as to face the mounting table 2. An exhaust duct 13 is installed in the upper portion of the processing vessel 1. An opening 131 is formed on the inner circumferential surface of the exhaust duct 13. The outer wall surface of the exhaust duct 13 is connected to an exhaust unit 14 including a vacuum pump or the like through an exhaust port 132 and by way of a pressure regulating valve 141. In FIG. 1, the film forming apparatus according to the present embodiment includes a carry-in/carry-out gate 11 for a wafer W, and a gate valve 12. The mounting table 2 is provided therein with a heater 21 for heating the wafer W to a deposition temperature of, e.g., 350 degree C. to 530 degree C. The region of the mounting table 2 outside the mounting region of the wafer is covered with a cover member 22. The cover member 22 is formed into a substantially cylindrical shape with the upper and lower ends thereof opened. The upper end of the cover member 22 is horizontally bent inward along the circumferential direction.

The central portion of the lower surface of the mounting table 2 is connected to an elevator mechanism 24 by a support member 23 vertically extending through the bottom surface of the processing vessel 1, with a support plate 231 interposed therebetween. The film forming apparatus according to the present embodiment includes a bellows 232 as shown in FIG. 1. The elevator mechanism 24 moves the mounting table 2 up and down between a delivery position in which the wafer W is delivered to and from a transfer mechanism not shown and a processing position (a position shown in FIG. 1) higher than the delivery position, in which a film is formed on the wafer W. The film forming apparatus according to the present embodiment includes support pins 25 configured to lift up the wafer W when the wafer W is delivered to and from the transfer mechanism, and a lift mechanism 26 for the support pins 25 as shown in FIG. 1. The mounting table 2 has through-holes 201 through which the support pins 25 penetrate.

A support plate 31 is installed on the upper surface of the exhaust duct 13. The ceiling plate member 3 configured to supply a reaction gas, a substituting gas and the like to a processing space 30 is arranged on the lower surface of the support plate 31. A recess portion 32 is formed on the lower surface of the ceiling plate member 3. A slant surface becoming wide from the central side toward the peripheral side of the recess portion 32 is formed on the lower surface of the ceiling plate member 3. An annular flat tip end portion 33 is formed at the outer side of the slant surface. When the mounting table 2 is moved up to the processing position, the lower surface of the tip end portion 33 of the ceiling plate member 3 is arranged to face the upper surface of the cover member 22. At this time, the space surrounded by the recess portion 32 of the ceiling plate member 3 and the upper surface of the mounting table 2 becomes a processing space 30 where a film is formed on the wafer W. The height of the processing position is set such that a clearance 34 is formed between the lower surface of the tip end portion 33 of the ceiling plate member 3 and the upper surface of the cover member 22. The opening 131 of the exhaust duct 13 is opened toward the clearance 34.

A gas supply path 41 configured to supply a reaction gas into the processing space 30 is formed in the central region of the recess portion 32 of the ceiling plate member 3. The gas supply path 41 vertically extends through the ceiling plate member 3. The lower end of the gas supply path 41 is opened downward toward the mounting table 2. The gas supply path 41 is connected to a gas supply system 5 through a connecting member 42 and a valve mechanism 43. The connecting member 42 is made of, e.g., stainless steel or hastelloy. Gas flow paths are formed in the connecting member 42. In this embodiment, the gas supply path 41 is branched into two flow paths 411 and 412 which are connected to the valve mechanism 43. The valve mechanism 43 includes, e.g., four valves V1 to V4. Gas supply paths 51 to 54 are respectively connected to the valves V1 to V4.

The gas supply system 5 will be described in detail with reference to FIG. 2. The valve V2 is connected to a titanium chloride supply path 52 as a supply path of a titanium chloride ($TiCl_4$) gas. The valve V3 is connected to an ammonia supply path 53 as a supply path of an ammonia ($NH_3$) gas. The valves V1 and V4 are respectively connected to substituting gas supply paths 51 and 54 as supply paths of a substituting gas, e.g., a nitrogen ($N_2$) gas. The titanium chloride supply path 52 and the ammonia supply path 53 correspond to the gas supply paths in the present disclosure.

One end of the titanium chloride supply path 52 is connected to a titanium chloride gas supply unit 521. At the upstream side of the valve V2 in the titanium chloride supply path 52, a retaining tank 61 constituting a retaining unit, a valve V21, a flow rate control unit MF2 and a valve V22 are sequentially installed in the named order from the side of the processing vessel 1. The titanium chloride supply path 52 is branched off from between the flow rate control unit MF2 and the valve V22 and is connected to a supply source 523 of a nitrogen gas as a purge gas through a branch path 522 provided with a valve V23. The titanium chloride supply path 52, the branch path 522, the valve V23 and the nitrogen gas supply source 523 correspond to a purge gas supply unit in the present disclosure. An exhaust path 524 is connected to between the valve V21 and the flow rate control unit MF2 in the titanium chloride supply path 52. The exhaust path 524 is connected to the exhaust unit 14 through a valve V24. The valves mentioned above serve to initiate and stop supplying gases. The flow rate control unit set forth above serves to adjust a gas supply amount. This holds true with respect to the valves and the flow rate control units to be described later.

Similarly, one end of the ammonia supply path 53 is connected to an ammonia gas supply unit 531. At the upstream side of the valve V3 in the ammonia supply path 53, a retaining tank 62 constituting a retaining unit, a valve V31, a flow rate control unit MF3 and a valve V32 are sequentially installed in the named order from the side of the processing vessel 1. The ammonia supply path 53 is branched off from between the flow rate control unit MF3 and the valve V32 and is connected to a supply source 533 of a nitrogen gas as a purge gas through a branch path 532 provided with a valve V33. The ammonia supply path 53, the branch path 532, the valve V33 and the nitrogen gas supply source 533 correspond to a purge gas supply unit in the present disclosure. An exhaust path 534 is connected to between the valve V31 and the flow rate control unit MF3 in the ammonia supply path 53. The exhaust path 534 is connected to the exhaust unit 14 through a valve V34.

The retaining tanks 61 and 62 have, e.g., a similar configuration, and are configured such that, when supplying gases by closing the valves V2 and V3 arranged between the retaining tanks 61 and 62 and the processing vessel 1, the gases are retained within the retaining tanks 61 and 62. As the gases are continuously supplied, the internal pressures of the retaining tanks 61 and 62 are increased. Manometers 63 and 64 configured to detect the internal pressures of the retaining tanks 61 and 62 are respectively installed in the retaining tanks 61 and 62. The retaining tanks 61 and 62 are made of, e.g., stainless steel, and are configured to have, e.g., a pressure resistance of 0.3 MPa (2250 Torr) and an internal volume of about 400 ml.

The substituting gas supply path 51 is connected to a nitrogen gas supply source 511 through a flow rate control unit MF1 and a valve V11. The substituting gas supply path 51 is branched off from between the flow rate control unit MF1 and the valve V11 and is connected to a supply source 513 of a chlorine fluoride ($ClF_3$) gas as a cleaning fluid through a branch path 512 provided with a valve V12. Similarly, the substituting gas supply path 54 is connected to a nitrogen gas supply source 541 through a flow rate control unit MF4 and a valve V41. The substituting gas supply path 54 is branched off from between the flow rate control unit MF4 and the valve V41 and is connected to a chlorine fluoride gas supply source 543 through a branch path 542 provided with a valve V42.

The film forming apparatus configured as above is connected to a control unit 7 as shown in FIG. 1. The control unit 7 includes, e.g., a computer provided with a CPU and a memory unit not shown. In the memory unit, there is recorded a program that incorporates a step (command) group regarding the operations of the film forming apparatus, namely the control performed when forming a film on the wafer W within the processing vessel 1, the control performed when cleaning the interior of the processing vessel 1 and the control performed when purging the interior of the processing vessel 1. The program is stored in a recording medium such as a hard disk, a compact disk, a magneto-optical disk, a memory card or the like and is installed from the recording medium into the computer.

Next, the operations of the present film forming apparatus will be described with reference to FIGS. 3 to 9B by implementing, for example, a film forming process, a cleaning process for the processing vessel 1 and a purging process. First, a film forming process will be described with reference to FIGS. 3 to 5B. After the interior of the processing vessel 1 is depressurized in advance, the wafer W is carried into the processing vessel 1 by a transfer mechanism not shown (step S1). By the cooperative work of the transfer mechanism and the support pins 25, the wafer W is delivered to the mounting table 2 which is kept in the delivery position and heated to, e.g., 440 degree C.

Figure 4A:
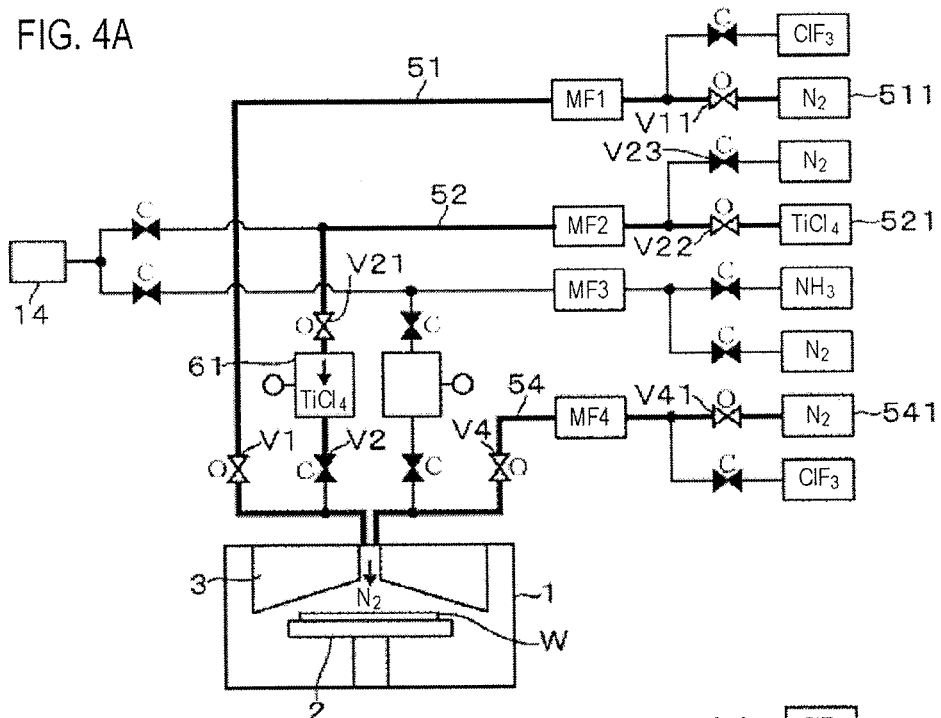
FIGS. 4A and 4B are configuration diagrams explaining a film forming process performed in the film forming apparatus.

Then, the mounting table 2 is moved up to the processing position. After regulating the internal pressure of the processing vessel 1, a titanium chloride gas is supplied through the titanium chloride supply path 52. When supplying the titanium chloride gas, as shown in FIG. 4A, the valve V2 is closed and the valves V21 and V22 are opened. Thus, the titanium chloride gas is supplied to the retaining tank 61 through the titanium chloride supply path 52 at a predetermined flow rate, e.g., 50 sccm, and is filled into the retaining tank 61 (step S2). Furthermore, the valves V1, V11, V4 and V41 are opened and a nitrogen gas is introduced into the processing vessel 1 through the substituting gas supply paths 51 and 54 at a flow rate of, e.g., 3000 sccm. Other valves such as the valve V23 and the like are kept closed. In FIGS. 4A to 6B, 8 to 9B, the opened valves are designated by "O" and indicated in white. The closed valves are designated by "C" and indicated in black. For the sake of convenience in illustration, the closed valves are often not designated by "C". Only the relevant valves are designated by "C".

Figure 4B:
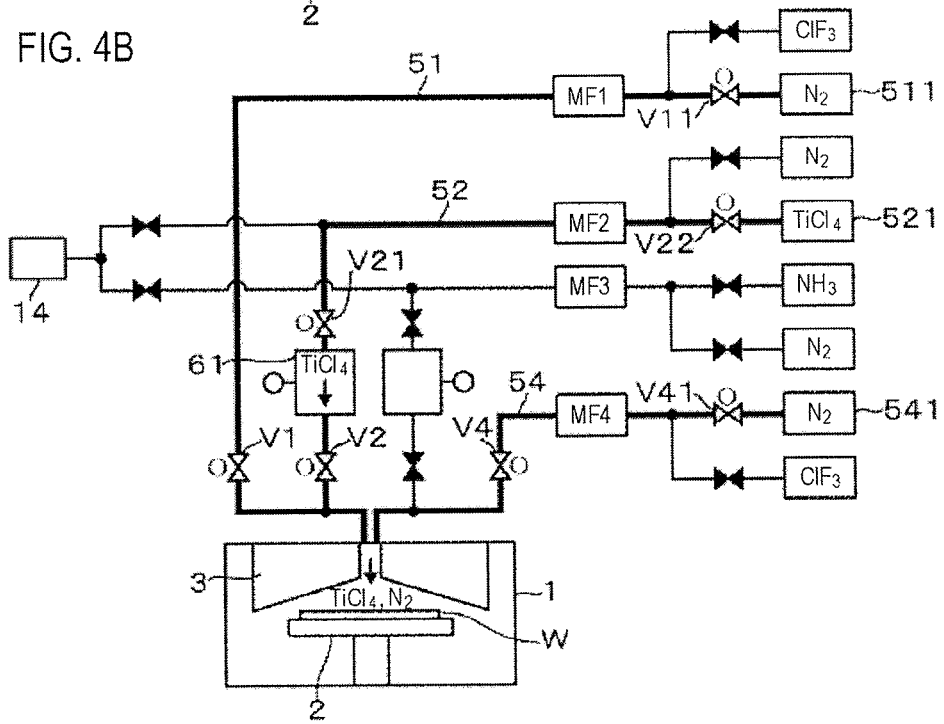

The internal pressure of the retaining tank 61 is gradually increased along with the supply of the titanium chloride gas. If the internal pressure of the retaining tank 61 is increased to a first pressure, e.g., 12.80 kPa (96 Torr) or more, as shown in FIG. 4B, the valve V2 is opened and a predetermined amount of titanium chloride gas is supplied into the processing vessel 1 (step S3). The first pressure is, e.g., a pressure higher than the internal pressure of the retaining tank 61 when starting the supply of the titanium chloride gas into the retaining tank 61, which remains empty, and is set in a range of, e.g., 12.40 kPa (93 Torr) to 13.07 kPa (98 Torr). In this step, the valve V2 is opened. Other valves are opened and closed in the same manner as in the case where the titanium chloride gas is filled into the retaining tank 61 (as shown in FIG. 4A). The titanium chloride gas and the nitrogen gas are supplied into the processing space 30 through the gas flow paths 411 and 412 of the connecting member 42 and the ceiling plate member 3 and the gas supply path 41. While being guided by the slant surface of the ceiling portion of the processing space 30, the titanium chloride gas and the nitrogen gas spread out from the central portion of the ceiling plate member 3 toward the outer peripheral portion thereof and arrive at the wafer W. The titanium chloride gas and the nitrogen gas arrived at the clearance 34 between the tip end portion 33 and the cover member 22 flow out from the clearance 34 into the processing vessel 1. Thereafter, the titanium chloride gas and the nitrogen gas are discharged to the outside through the exhaust duct 13.

If the titanium chloride gas is supplied into the processing vessel 1 by opening the valve V2, the internal pressure of the retaining tank 61 is decreased. When the internal pressure of the retaining tank 61 is reduced to, e.g., 12.40 kPa (93 Torr) or less, the valve V2 is closed to stop the supply of the titanium chloride gas. While keeping the valves V1 and V4 opened, a nitrogen gas is supplied from the substituting gas supply paths 51 and 54 into the processing vessel 1 at a flow rate of, e.g., 3000 sccm (step S4). The nitrogen gas is supplied to the processing space 30 through the gas flow paths 411 and 412 and the gas supply path 41. After flowing out into the processing vessel 1, the nitrogen gas is exhausted from the exhaust duct 13. In this way, the titanium chloride gas existing within the gas route and the processing space 30 is substituted by the nitrogen gas.

Figure 5A:
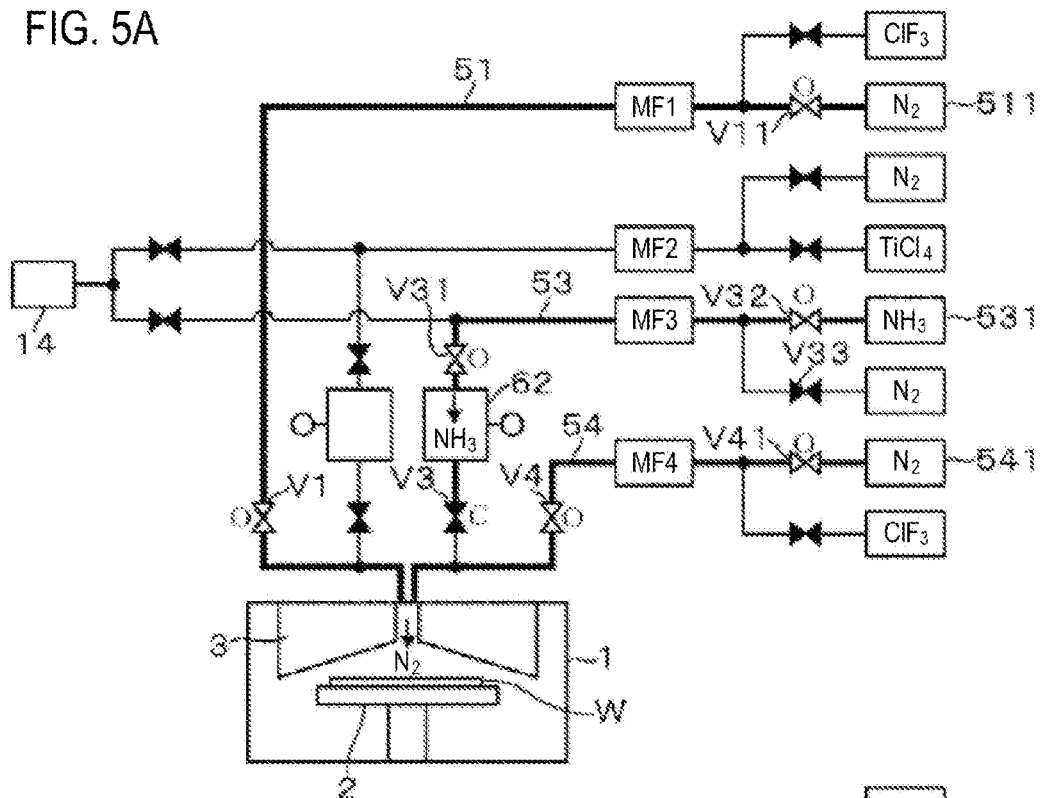
FIGS. 5A and 5B are configuration diagrams explaining a film forming process performed in the film forming apparatus.
Figure 5B:
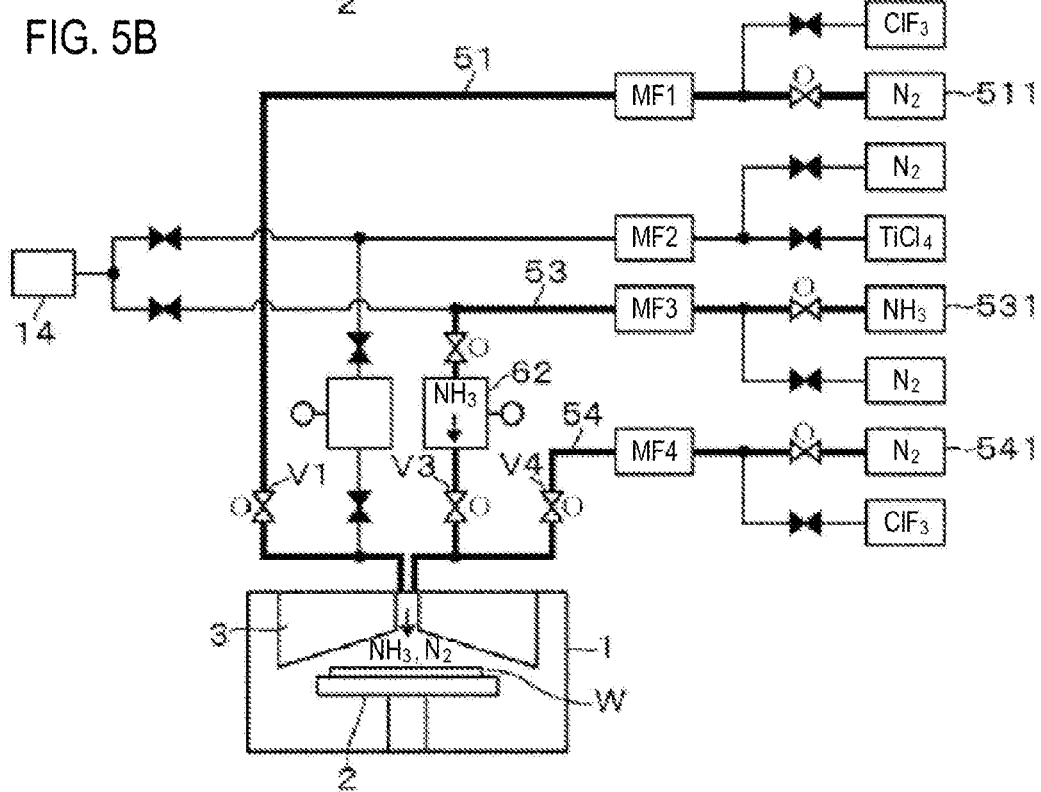

After the titanium chloride gas is substituted by the supply of the nitrogen gas, an ammonia gas is supplied into the processing vessel 1 through the ammonia gas supply path 53. When supplying the ammonia gas, as shown in FIG. 5A, the valve V3 is closed and the valves V31 and V32 are opened. Thus, the ammonia gas is supplied into the retaining tank 62 at a predetermined flow rate, e.g., 2700 sccm, and fills the retaining tank 62 (step S5). Furthermore, the valves V1 and V4 are opened and the nitrogen gas is introduced into the processing vessel 1 through the substituting gas supply paths 51 and 54 at a flow rate of, e.g., 3000 sccm. Other valves such as the valve V33 and the like are kept closed.

If the internal pressure of the retaining tank 62 is increased to a second pressure, e.g., 21.73 kPa (163 Torr) or more, by the supply of the ammonia gas, as shown in FIG. 5A, the valve V3 is opened and a predetermined amount of ammonia gas is supplied into the processing vessel 1 (step S6). The second pressure is, e.g., a pressure higher than the internal pressure of the retaining tank 62 when starting the supply of the ammonia gas into the retaining tank 62, which remains empty, and is set in a range of, e.g., 19.20 kPa (144 Torr) to 24.93 kPa (187 Torr). In this step, the valve V3 is opened. Other valves are opened and closed in the same manner as in the case where the ammonia gas fills the retaining tank 62 (as shown in FIG. 5A). The ammonia gas supplied into the processing vessel 1 flows just like the titanium chloride gas and is supplied into the processing space 30. If the ammonia gas flowing within the processing space 30 reaches the surface of the wafer W, the component of the titanium chloride gas adsorbed to the wafer W is nitrided by the ammonia gas. Thus, titanium nitride is formed.

If the ammonia gas is supplied into the processing vessel 1 by opening the valve V3, the internal pressure of the retaining tank 62 is decreased. When the internal pressure of the retaining tank 62 is reduced to, e.g., 19.33 kPa (145 Torr) or less, the valve V3 is closed to stop the supply of the ammonia gas. While keeping the valves V1 and V4 opened, a nitrogen gas is supplied from the substituting gas supply paths 51 and 54 into the processing vessel 1 at a flow rate of, e.g., 3000 sccm (step S6). In this way, the ammonia gas existing within the processing space 30 is substituted by the substituting nitrogen gas supplied from the substituting gas supply paths 51 and 54 into the processing vessel 1 (step S7).

In the aforementioned manner, the reaction gases (the titanium chloride gas and the ammonia gas) and the substituting gas (the nitrogen gas) are supplied in the order of the titanium chloride gas, the nitrogen gas, the ammonia gas and the nitrogen gas. Thus, molecular layers of titanium nitride (TiN) are deposited on the surface of the wafer W to form a titanium nitride film. The process of supplying the titanium chloride gas and the process of supplying the ammonia gas are repeated dozens of times or hundreds of times, thereby forming a titanium nitride film having a desired thickness. In one example of the supply time of the titanium chloride gas, the nitrogen gas, the ammonia gas and the nitrogen gas, the supply time of the titanium chloride gas is 0.05 second, the supply time of the nitrogen gas is 0.2 second, the supply time of the ammonia gas is 0.3 second, and the supply time of the nitrogen gas is 0.3 second. After the last ammonia gas is discharged by supplying the substituting nitrogen gas in this manner, the mounting table 2 is moved down to the delivery position. Then, the film-formed wafer W is carried out in the opposite order to the carry-in order of the wafer W (step S8). Thereafter, the film forming apparatus waits until the next wafer W is carried in.

In this example, when filling the retaining tank 61 (or 62) with the titanium chloride gas (or the ammonia gas), the supply amount and the supply time of the titanium chloride gas (or the ammonia gas) for the retaining tank 61 (or 62) are set such that the internal pressure of the retaining tank 61 (or 62) becomes the first pressure (or the second pressure) at a predetermined time point. For instance, by adjusting the supply time of the titanium chloride gas (or the ammonia gas) while keeping the supply amount thereof constant, the internal pressure of the retaining tank 61 (or 62) is set to become the first pressure (or the second pressure) at a predetermined time point. The opening/closing of the valves V2 and V3 is controlled based on the aforementioned supply time. When supplying the titanium chloride gas (or the ammonia gas) from the retaining tank 61 (or 62) into the processing vessel 1, the supply time of the titanium chloride gas (or the ammonia gas) into the processing vessel 1 may be a duration of time for the internal pressure of the retaining tank 61 (or 62) to become a predetermined pressure, e.g., 12.80 kPa (96 Torr) [or 21.73 kPa (163 Torr)]. Such supply time is set in advance. The opening/closing of the valves V2 and V3 which are controlled based on the supply time are thus also set in advance.

In the aforementioned process, it is only necessary that the gases be switched and supplied into the processing vessel 1 in the order of the titanium chloride gas, the nitrogen gas, the ammonia gas and the nitrogen gas. For example, the processes of filling the retaining tanks 61 and 62 with the titanium chloride gas and the ammonia gas are performed in parallel. Moreover, for example, the supply of one of the titanium chloride gas and the ammonia gas into the processing vessel 1 and the filling the retaining tank 61 (or 62) with the other of the titanium chloride gas and the ammonia gas are performed in parallel.

Figure 6A:
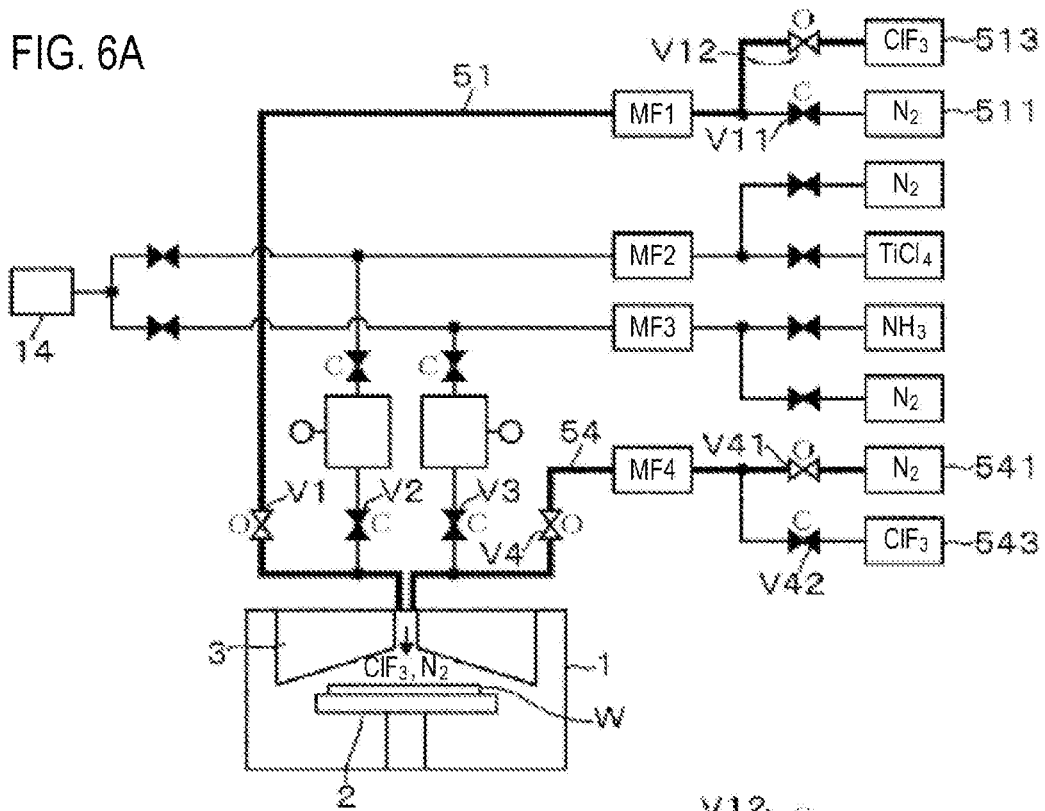
FIGS. 6A and 6B are configuration diagrams explaining a cleaning process performed in the film forming apparatus.
Figure 6B:
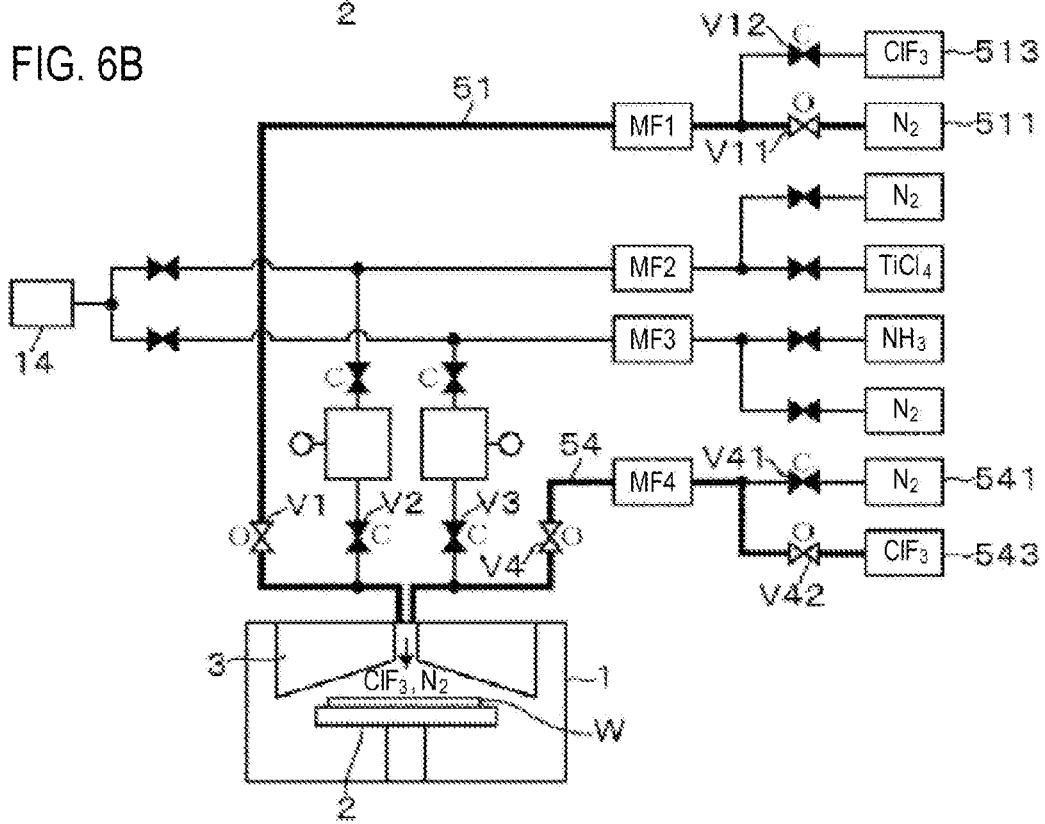
Figure 7:
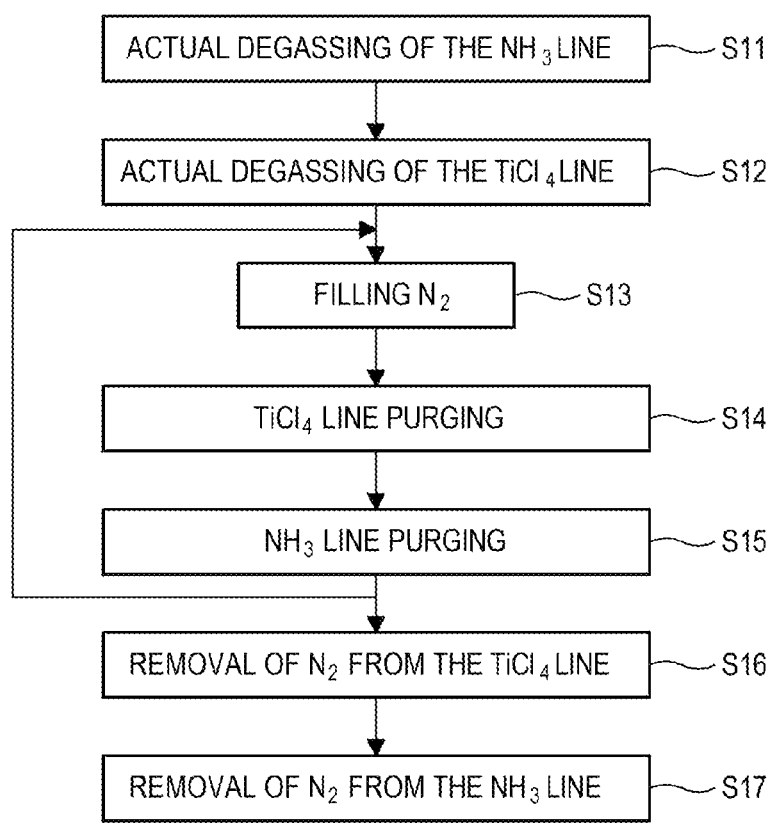
FIG. 7 is a flowchart illustrating one example of a purging process performed in the film forming apparatus.

After the aforementioned film forming process is performed with respect to, e.g., 500 wafers W, cleaning is performed. In the reaction gas arriving region within the processing vessel 1, a film is formed by the reaction of the titanium chloride gas and the ammonia gas and is gradually deposited. The cleaning is performed to remove the deposited film existing within the processing vessel 1. More specifically, for example, the interior of the processing vessel 1 is evacuated in an open state (in which the pressure regulating valve 141 is completely opened). Thereafter, as shown in FIG. 6A, the valves V1 and V12 are opened and a chlorine fluoride gas is supplied through the substituting gas supply path 51 at a predetermined flow rate for a predetermined time. At this time, the valves V4 and V41 are opened and the nitrogen gas is supplied through the substituting gas supply path 54 at a predetermined flow rate. After the predetermined time is lapsed, the valves V1, V4, V12 and V41 are closed. Then, as shown in FIG. 6B, the valves V4 and V42 are opened and a chlorine fluoride gas is supplied through the substituting gas supply path 54 at the predetermined flow rate for the predetermined time. At this time, the valves V1 and V11 are opened and the nitrogen gas is supplied through the substituting gas supply path 51 at the predetermined flow rate.

The chlorine fluoride gas is supplied into the processing space 30 through the gas flow paths 411 and 412 and the gas supply path 41. The chlorine fluoride gas flows along the same route as the flow route of the reaction gas. Then, the chlorine fluoride gas flows into the processing vessel 1 from the clearance 34 and is discharged to the outside through the exhaust duct 13. Since the chlorine fluoride gas is supplied to the reaction gas arriving region in this manner, the film deposited within the processing vessel 1 is removed. After the cleaning is performed by supplying the chlorine fluoride gas for a predetermined time, the processing vessel 1 is vacuum-evacuated. By closing the valves V12 and V42 and opening the valves V1, V11, V4 and V41, the nitrogen gas is introduced into the processing vessel 1 through the substituting gas supply paths 51 and 54. After performing this process for the predetermined time, the evacuation of the processing vessel 1 is stopped and the valves V1, V11, V4 and V41 are closed. Thus, the cleaning process is terminated.

After performing the cleaning process, a purging process is performed. The purging process is performed by supplying the nitrogen gas as a purge gas to the titanium chloride supply path 52 and the ammonia supply path 53, which are the reaction gas supply paths. The purging process will be described in detail with reference to FIGS. 7 to 9B. First, the actual degassing of the ammonia supply path (NH₃ line) 53 is performed (step S11). This step is performed by opening the valves V1, V11, V4, V41, V31 and V34, closing the valves other than valves V1, V11, V4, V41, V31 and V34 and exhausting the gas with the exhaust unit 14. Thus, the portion of the ammonia supply path 53 positioned at the upstream side of the valve V3 is evacuated and the gas remaining within the ammonia supply path 53 is removed. Then, the actual degassing of the titanium chloride supply path (TiCl₄ line) 52 is performed (step S12). This step is performed by opening the valves V1, V11, V4, V41, V21 and V24, closing the valves other than valves V1, V11, V4, V41, V21 and V24 and exhausting the gas with the exhaust unit 14. Thus, the portion of the titanium chloride supply path 52 positioned at the upstream side of the valve V2 is evacuated and the gas remaining within the titanium chloride supply path 52 is removed.

Figure 8:
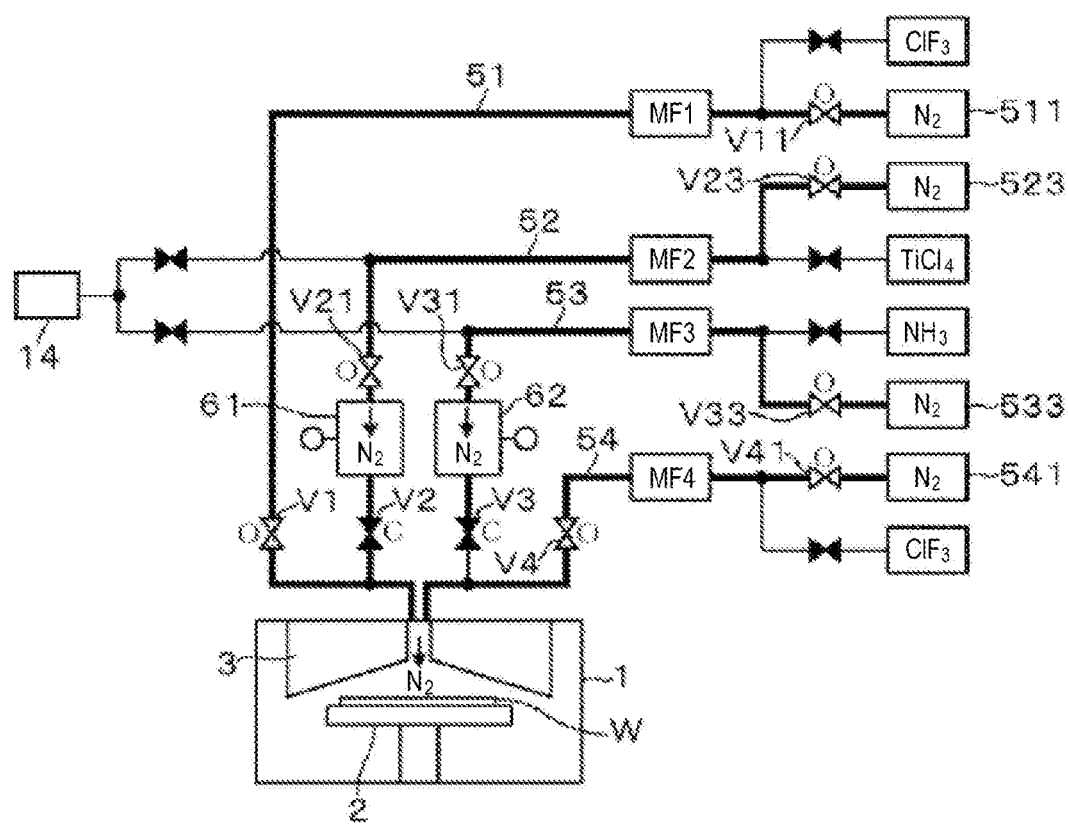
FIG. 8 is a configuration diagram explaining the purging process performed in the film forming apparatus.

Subsequently, as shown in FIG. 8, the nitrogen gas as a purge gas fills the retaining tanks 61 and 62 (step S13). That is to say, the valves V1, V11, V4, V41, V21, V23, V31 and V33 are opened and the valves other than the valves V1, V11, V4, V41, V21, V23, V31 and V33 are closed. Since the valves V2 and V3 are kept closed, the nitrogen gas flowing through the titanium chloride supply path 52 and the ammonia supply path 53 are respectively retained in the retaining tanks 61 and 62. In this way, the nitrogen gas is supplied into the retaining tank 61 through the titanium chloride supply path 52 at a predetermined flow rate, e.g., 190 sccm, and fills the retaining tank 61. Moreover, the nitrogen gas is supplied into the retaining tank 62 through the ammonia gas supply path 53 at a predetermined flow rate, e.g., 900 sccm, and fills the retaining tank 62. In addition, the nitrogen gas is introduced into the processing vessel 1 through the substituting gas supply paths 51 and 54 at a flow rate of, e.g., 3000 sccm.

Figure 9A:
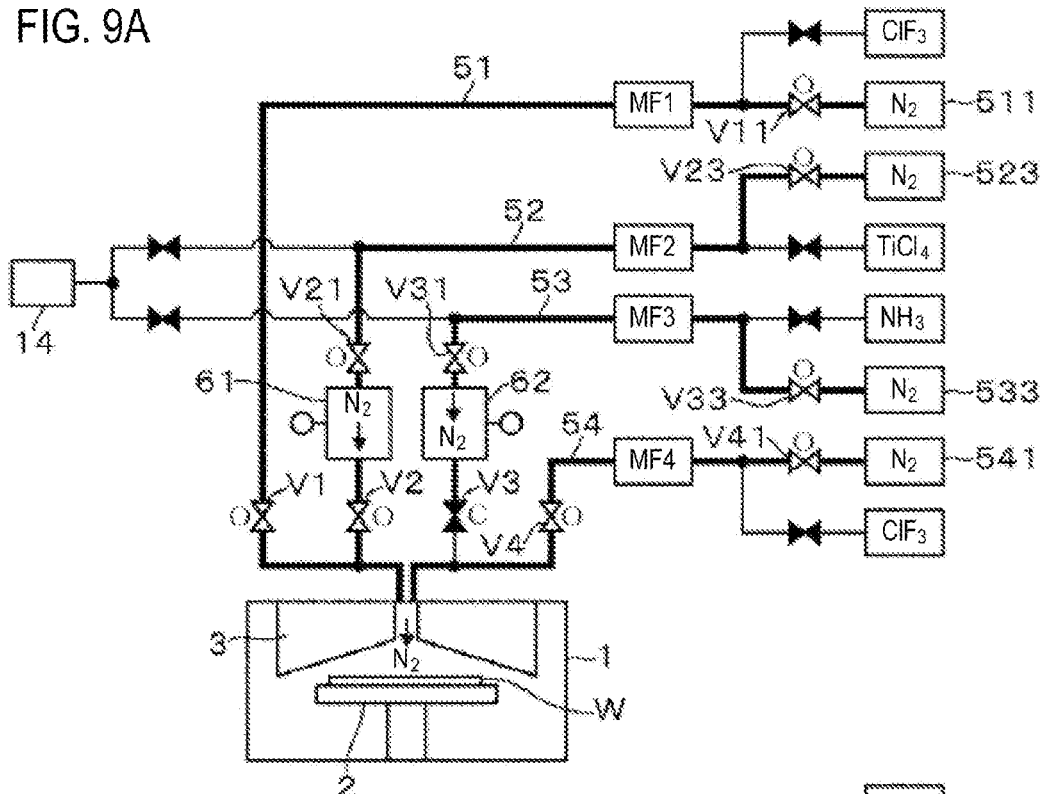
FIGS. 9A and 9B are configuration diagrams explaining the purging process performed in the film forming apparatus.

The internal pressures of the retaining tanks 61 and 62 are gradually increased by the supply of the nitrogen gas. If the internal pressure of the retaining tank 61 becomes higher than the first pressure, e.g., 56.00 kPa (420 Torr), as shown in FIG. 9A, the valve V2 is opened. Thus, the purging process is performed by supplying the nitrogen gas from the retaining tank 61 into the processing vessel 1 through the titanium chloride supply path 52 (step S14). In this state, the valves V1, V11, V4, V41, V2, V21, V23, V31 and V33 are kept opened. If the nitrogen gas (purge gas) pressurized within the retaining tank 61 is supplied into the processing vessel 1, the nitrogen gas is rapidly diffused within the processing space 30 due to the pressure difference and is spread out into the processing vessel 1 through the clearance 34. Since the nitrogen gas is pressurized within the retaining tank 61 and then supplied to the processing vessel 1, the nitrogen gas is fed to the processing vessel 1 at a high pressure. Accordingly, a strong flow of the nitrogen gas is generated in the nitrogen gas flow path positioned at the downstream side of the retaining tank 61. Particles existing in the flow path are removed together with the flow of the nitrogen gas.

If the purge gas is supplied from the retaining tank 61 to the processing vessel 1 in this way, the internal pressure of the retaining tank 61 is decreased. When the internal pressure of the retaining tank 61 becomes, e.g., 46.66 kPa (350 Torr), the valve V2 is closed to stop the supply of the nitrogen gas into the processing vessel 1. Thus, the nitrogen gas filling process of step S13 is performed again through the titanium chloride supply path 52. The internal pressure of the retaining tank 61 is gradually increased by the supply of the nitrogen gas into the retaining tank 61. If the internal pressure of the retaining tank 61 becomes 56.00 kPa (420 Torr), the valve V2 is opened and the purging process is performed by supplying the nitrogen gas into the processing vessel 1. In the titanium chloride supply path 52, the process of filling the retaining tank 61 (step S13) with the nitrogen gas into and the process of purging the processing vessel 1 with the nitrogen gas (step S14) are repeated, e.g., 1000 times. At this time, the purging of the processing vessel 1 with the nitrogen gas is performed for, e.g., 0.1 second. The filling the retaining tank with the nitrogen gas is performed for, e.g., 3 seconds.

Figure 9B:
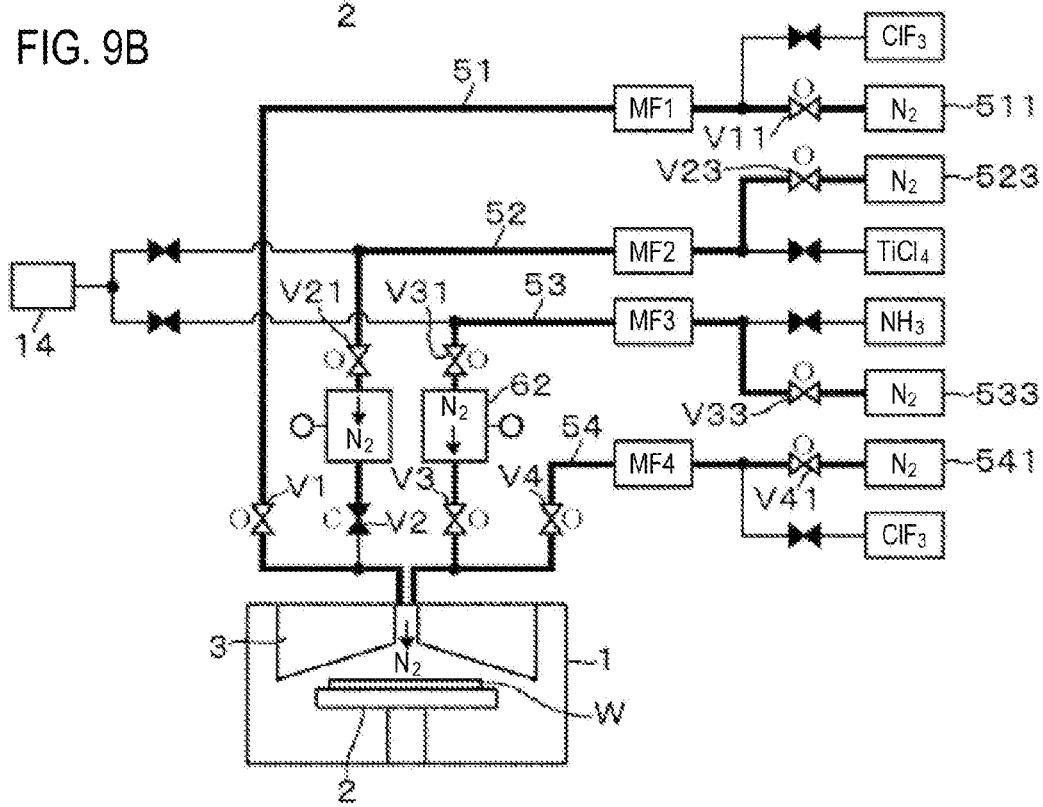

Similarly, if the internal pressure of the retaining tank 62 becomes higher than the second pressure, e.g., 56.00 kPa (420 Torr) y the supply of the nitrogen gas through the ammonia supply path 53, as shown in FIG. 9B, the valve V3 is opened. Thus, the purging process is performed by supplying the nitrogen gas from the retaining tank 62 into the processing vessel 1 through the ammonia supply path 53 (step S15). In this state, the valves V1, V11, V4, V41, V21, V23, V3, V31 and V33 are kept opened. Accordingly, a strong flow of the nitrogen gas is generated in the nitrogen gas flow path positioned at the downstream side of the retaining tank 62. Particles existing in the flow path are removed together with the flow of the nitrogen gas.

In this way, the nitrogen gas is supplied from the retaining tank 62 to the processing vessel 1. If the internal pressure of the retaining tank 61 becomes, e.g., 46.66 kPa (350 Torr), the valve V3 is closed to stop the supply of the nitrogen gas into the processing vessel 1. Thus, the nitrogen gas filling process of step S13 is performed again through the ammonia gas supply path 53. The internal pressure of the retaining tank 62 is gradually increased by the supply of the nitrogen gas into the retaining tank 62. If the internal pressure of the retaining tank 62 becomes about 56.00 kPa (420 Torr), the valve V3 is opened and the ammonia supply path 53 is purged by supplying the nitrogen gas into the processing vessel 1. In the ammonia supply path 53, the process of filling the retaining tank 62 (step S13) with the nitrogen gas and the process of purging the processing vessel 1 with the nitrogen gas (step S15) are repeated, e.g., 1000 times. At this time, the process of purging the processing vessel 1 with the nitrogen gas is performed for, e.g., 0.1 second. The process of filling the retaining tank 62 with the nitrogen gas is performed for, e.g., 2 seconds.

In the example, when the process of filling the retaining tanks 61 and 62 with the nitrogen gas, the supply amount and the supply time of the nitrogen gas into the retaining tanks 61 and 62 are set such that the internal pressures of the retaining tanks 61 and 62 become about 56.00 kPa (420 Torr) at a predetermined time point. The opening/closing of the valves V2 and V3 is controlled based on the aforementioned supply time. At this time, the supply amount of the nitrogen gas need not be necessarily constant during the process of filling the retaining tanks 61 and 62 with the nitrogen gas. When supplying the nitrogen gas from the retaining tanks 61 and 62 into the processing vessel 1, the supply time of the nitrogen gas into the processing vessel 1 may be a duration of time for the internal pressures of the retaining tanks 61 and 62 to become a predetermined pressure (46.66 kPa (350 Torr)). Such supply time is set in advance. The opening/closing of the valves V2 and V3 which are controlled based on the supply time are thus also set in advance.

The nitrogen gas may fill the retaining tank 61 until the internal pressure of the retaining tank 61 becomes higher than the first pressure used when the titanium chloride gas is supplied to the retaining tank 61. Similarly, the nitrogen gas may fill the retaining tank 62 until the internal pressure of the retaining tank 62 becomes higher than the second pressure used when the ammonia gas is supplied to the retaining tank 62. The internal pressures of the retaining tanks 61 and 62 used during the process of filling the retaining tanks 61 and 62 with the nitrogen gas are appropriately set in view of the pressure resistance of the retaining tanks 61 and 62, the supply amount of the nitrogen gas and the supply time of the nitrogen gas.

It is preferred that the differential value between the pressure (56.00 kPa (420 Torr)) of the retaining tanks 61 and 62 when starting the discharge of the nitrogen gas from the retaining tanks 61 and 62 and the pressure (46.66 kPa (350 Torr)) of the retaining tanks 61 and 62 and when stopping the discharge of the nitrogen gas from the retaining tanks 61 and 62 is larger than the differential value of the pressures of the retaining tanks 61 and 62 during the supply of the reaction gases. If the differential value is set too large, a prolonged period of time is required in increasing the internal pressures of the retaining tanks 61 and 62 again. If the internal pressures of the retaining tanks 61 and 62 during the supply of the purge gas are too low, the purging effect is reduced. Accordingly, for example, when supplying the purge gas into the processing vessel 1, it is preferred that the valve V2 is closed and the internal pressures of the retaining tanks 61 and 62 are increased again when the internal pressures of the retaining tanks 61 and 62 become equal to 80% to 90% of the internal pressures of the retaining tanks 61 and 62 (56.00 kPa (420 Torr) in this example) at the time of starting the discharge of the purge gas from the retaining tanks 61 and 62.

The process of filling the retaining tank 61 with the nitrogen gas and the process of filling the retaining tank 62 with the nitrogen gas may be started at different timings or at the same timing. Similarly, the process of supplying the nitrogen gas from the retaining tank 61 into the processing vessel 1 and the process of supplying the nitrogen gas from the retaining tank 62 into the processing vessel 1 may be started at different timings.

In the aforementioned example, the opening/closing of the valves V2 and V3 is not controlled based on the detection values of the manometers 63 and 64 installed in the retaining tanks 61 and 62. For that reason, strictly speaking, there may occur a case where the valves V2 and V3 are opened to discharge the reaction gases before the internal pressure of the retaining tanks 61 and 62 becomes equal to the first pressure or the second pressure and a case where the valves V2 and V3 are closed to fill the retaining tanks 61 and 62 with the reaction gases before the internal pressure of the retaining tanks 61 and 62 becomes equal to or lower than the predetermined pressure (17.33 kPa (130 Torr) or 25.33 kPa (190 Torr)).

However, the effects of the present disclosure can be obtained if the internal pressure of the retaining tanks 61 and 62 becomes higher than the internal pressure of the retaining tanks 61 and 62 when starting the supply of the reaction gases to the empty retaining tanks 61 and 62. Accordingly, the first pressure or the second pressure is nothing more than a guideline. In reality, the opening of the valves V2 and V3 before the internal pressure of the retaining tanks 61 and 62 becomes equal to or higher than the first pressure or the second pressure and the closing of the valves V2 and V3 before the internal pressure of the retaining tanks 61 and 62 becomes equal to or lower than the predetermined pressure (12.80 kPa (96 Torr) or 21.73 kPa (163 Torr)) are included in the scope of the present disclosure.

This holds true in case where the purge gas (nitrogen gas) is supplied into the processing vessel 1. The effects of the present disclosure can be obtained if the internal pressure of the retaining tanks 61 and 62 becomes higher than the first pressure or the second pressure. The target pressure used when filling the retaining tanks 61 and 62 with the nitrogen gas is set equal to, e.g., 56.00 kPa (420 Torr). Thus, in reality, the opening of the valves V2 and V3 at a stage where the internal pressure of the retaining tanks 61 and 62 is lower than the target pressure and the closing of the valves V2 and V3 before the internal pressure of the retaining tanks 61 and 62 becomes equal to or lower than the predetermined pressure (46.00 kPa (350 Torr)) are included in the scope of the present disclosure.

After performing the purging process through the titanium chloride supply path 52 and the purging process through the ammonia supply path 53 in this manner, the removal of the nitrogen gas remaining in the titanium chloride supply path (TiCl$_4$ line) 52 (step S16) and the removal of the nitrogen gas remaining in the ammonia supply path (NH$_3$ line) 53 (step S17) are performed. Thus, the purging process is terminated. The removal of the nitrogen gas remaining in the titanium chloride supply path 52 is performed by opening the valves V1, V11, V4, V41, V21 and V24, closing the valves other than valves V1, V11, V4, V41, V21 and V24 and exhausting the gas with the exhaust unit 14. Thus, the portion of the titanium chloride supply path 52 positioned at the upstream side of the valve V2 is evacuated and the nitrogen gas remaining within the titanium chloride supply path 52 is removed. The removal of the nitrogen gas remaining in the ammonia supply path 53 is performed by opening the valves V1, V11, V4, V41, V31 and V34, closing the valves other than valves V1, V11, V4, V41, V31 and V34 and exhausting the gas with the exhaust unit 14. Thus, the portion of the ammonia supply path 53 positioned at the upstream side of the valve V3 is evacuated and the nitrogen gas remaining within the ammonia supply path 53 is removed. During a series of purging processes shown in FIG. 7, the nitrogen gas is introduced into the processing vessel 1 through the substituting gas supply paths 51 and 54 at a flow rate of, e.g., 3000 sccm. After performing the purging process in this manner, for example, the pre-coating of the interior of the processing vessel 1 is carried out and the film forming process is performed again. The pre-coating is a process in which a film is formed on the inner surface of the processing vessel 1 by allowing the same gases as used in the film forming process to flow through the processing vessel 1.

According to the embodiment described above, the retaining tanks 61 and 62 are respectively installed in the titanium chloride supply path 52 and the ammonia supply path 53. When supplying the reaction gases into the processing vessel 1, the valves V2 and V3 existing between the retaining tanks 61 and 62 and the processing vessel 1 are closed first. Then, the reaction gases are continuously supplied to the retaining tanks 61 and 62, thereby increasing the internal pressures of the retaining tanks 61 and 62. Thus, the internal pressures of the retaining tanks 61 and 62 become higher than the internal pressures of the titanium chloride supply path 52 and the ammonia supply path 53 when the reaction gases are allowed to flow through the supply paths 52 and 53 without installing the retaining tanks 61 and 62. After the internal pressures of the retaining tanks 61 and 62 are increased to the first pressure and the second pressure, the valves V2 and V3 are opened to supply the reaction gases into the processing vessel 1. Thus, the reaction gases are supplied to the processing vessel 1 at a supply pressure higher than the supply pressure when the internal pressures of the retaining tanks 61 and 62 are not increased. Since the interior of the processing vessel 1 is vacuum-evacuated, a large pressure difference is generated when supplying the reaction gases into the processing vessel 1. Thus, the reaction gases are rapidly diffused within the processing space 30. This makes it possible to uniformly supply the reaction gases to the surface of the wafer W and to form a film having high in-pane uniformity. Inasmuch as the reaction gases are supplied into the processing vessel 1 at a high supply pressure, it is possible to shorten the supply time of the reaction gases supplied in a specified amount, which assists in enhancing the throughput.

When performing the purging process, the purge gas is continuously supplied into the retaining tanks 61 and 62 to make the internal pressures of the retaining tanks 61 and 62 higher than the internal pressures of the retaining tanks 61 and 62 available when supplying the reaction gases. Thereafter, the purge gas is supplied into the processing vessel 1. Accordingly, at the downstream side of the retaining tanks 61 and 62, the purge gas is supplied at a pressure higher than the pressure available when the reaction gases are supplied into the processing vessel 1. Thus, during the supply of the purge gas, particles existing in the flow paths of the downstream side of the retaining tanks 61 and 62 are removed together with the purge gas by the strong flow of the purge gas. As a result, when the reaction gases are supplied into the processing vessel 1 subsequent to the supply of the purge gas, the amount of the particles carried into the processing vessel 1 by the reaction gases is reduced and the particle contamination of the wafer W can be prevented. Since the purge gas is supplied into the retaining tanks 61 and 62 through the titanium chloride supply path 52 and the ammonia supply path 53, particles existing in the titanium chloride supply path 52 and the ammonia supply path 53 are removed by the circulation of the purge gas. It is therefore possible to further reduce the particle contamination of the wafer W.

For example, after performing the cleaning process, the cleaning residues may not be fully exhausted but remains as particles in the cleaning gas flow paths such as the processing vessel 1, the connecting member 42 and the like. If the purging process is performed after the cleaning process, even when the residues adhere to the inner walls of the connecting member 42 and the processing vessel 1, the deposits are detached from the inner walls by the strong impact force applied by the purge gas and are discharged out of the processing vessel 1 together with the strong flow of the purge gas. After performing the purging process, the reaction gases are supplied into the processing vessel 1 to form the film forming process. As described above, the supply pressure of the reaction gases supplied at this time is lower than the supply pressure of the purge gas. For that reason, even if cleaning residues adhere to the reaction gas flow paths such as the connecting member 42 and the processing vessel 1, the cleaning residues could not be removed because they were not moved together with the purge gas even when the purge gas was introduced at a high supply pressure. Accordingly, it is hard to image that, when supplying the supply of the reaction gases, the cleaning residues are moved together with the reaction gases and are attached to the wafer W as particles. As mentioned above, the particle contamination of the wafer W can be further reduced by performing the purging process after the cleaning process.

As described above, when supplying the purge gas, the pressure variation within the retaining tanks 61 and 62 is larger than the pressure variation when supplying the reaction gases. For that reason, when repeatedly supplying the purge gas, a pressure variation larger than the pressure variation when repeatedly supplying the reaction gases is repeatedly generated within the processing vessel 1. Thus, when supplying the purge gas, particles adhering to the gas flow paths of the downstream side of the retaining tanks 61 and 62 are easy to rise up and move together with the flow of the purge gas due to the pressure variation. In this respect, it is possible to reduce the particles.

In the embodiment described above, the reaction gases and the purge gas may be supplied into the processing vessel 1 by, e.g., detecting the internal pressures of the retaining tanks 61 and 62 and opening or closing the valves V2 and V3 based on the detection values. In this case, for example, if the internal pressures of the retaining tanks 61 and 62 become a predetermined upper limit value, the valves V2 and V3 existing between the retaining tanks 61 and 62 and the processing vessel 1 are opened to supply the reaction gases or the purge gas into the processing vessel 1. If the internal pressures of the retaining tanks 61 and 62 are decreased to a predetermined lower limit value by the supply of the reaction gases or the purge gas from the retaining tanks 61 and 62, a control operation is performed such the valves V2 and V3 are closed to increase the internal pressures of the retaining tanks 61 and 62 to the upper limit value again.

Moreover, the reaction gases and the purge gas may be supplied into the processing vessel 1 by, e.g., controlling the flow rates of the gases supplied into the retaining tanks 61 and 62 so that the internal pressures of the retaining tanks 61 and 62 can become constant, and opening or closing the valves V2 and V3 based on the supply time of the gases supplied to the retaining tanks 61 and 62. In this case, if the gases are discharged from the retaining tanks 61 and 62, the internal pressures of the retaining tanks 61 and 62 are decreased. Therefore, the amounts of the gases supplied to the retaining tanks 61 and 62 are increased. For example, a control operation is performed such that the internal pressures of the retaining tanks 61 and 62 become a predetermined value at a predetermined time. After a specified period of time is lapsed, the valves V2 and V3 existing between the retaining tanks 61 and 62 and the processing vessel 1 are opened to supply the reaction gases or the purge gas into the processing vessel 1. Thus, the internal pressures of the retaining tanks 61 and 62 are decreased. Therefore, for example, the valves V2 and V3 are closed after the lapse of the specified period of time. A control operation is performed such that the internal pressures of the retaining tanks 61 and 62 are increased again.

In the aforementioned embodiment, the purge gas (nitrogen gas) is supplied to the retaining tanks 61 and 62 through the titanium chloride supply path 52 and the ammonia supply path 53. Alternatively, the purge gas may be directly supplied to the retaining tanks 61 and 62 without going through the titanium chloride supply path 52 and the ammonia supply path 53. Even in this case, particles existing in the gas flow paths of the downstream side of the retaining tanks 61 and 62 are removed by the circulation of the purge gas. It is therefore possible to prevent particle contamination of the wafer W. Instead of using the retaining tanks 61 and 62 as retaining units, certain portions of the gas supply paths may be used as retaining units. The internal pressures of the retaining units may be increased by opening or closing the valves disposed at the upstream and downstream sides of the retaining units.

The purging process may be implemented not after the cleaning process but after the film forming process. Even in this case, if the purging process is performed, particles adhering to the portions which make contact with the reaction gases are removed by the circulation of the purge gas. It is therefore possible to reduce particle contamination of the wafer W. Furthermore, without installing the substituting gas supply paths 51 and 54, the nitrogen gas as a substituting gas may be supplied to the processing vessel 1 through the titanium chloride supply path 52 and the ammonia supply path 53. Moreover, the cleaning process may be performed by supplying into the processing vessel 1 a cleaning fluid including not only the chlorine-fluorine-based gas such as a chlorine fluoride ($ClF_3$) gas or the like but also a halogen-based cleaning gas, e.g., a fluorine-based gas such as a nitrogen trifluoride ($NF_3$) gas, an ethane hexafluoride ($C_2F_2$) gas or the like and a chlorine-based gas such as a chlorine ($Cl_2$) gas or the like.

In addition, the film forming apparatus of the present disclosure may form not only the TiN film mentioned above but also a film including a metallic element, e.g., an element of the third period of the periodic table such as Al, Si or the like, an element of the fourth period of the periodic table such as Ti, Cr, Mn, Fe, Co, Ni, Cu, Zn, Ge or the like, an element of the fifth period of the periodic table such as Zr, Mo, Ru, Rh, Pd, Ag or the like, or an element of the sixth period of the periodic table such as Ba, Hf, Ta, W, Re, Ir, Pt or the like. As metallic materials adsorbed to the surface of the wafer W, it may be possible to use organic metal compounds or inorganic metal compounds of the aforementioned metallic elements which are supplied as reaction gases (source gases). Specific examples of the metallic materials include not only $TiCl_4$ mentioned above but also BTBAS ((bistertial butylamino)silane), DCS (dichlorosilane), HCD (hexadichlorosilane), TMA (trimethyl aluminum), 3DMAS (trisdimethylaminosilane), and so forth.

As a reaction in which a desired film is obtained by reacting the source gases adsorbed to the surface of the wafer W, it may be possible to use various kinds of reactions, e.g., an oxidation reaction using $O_2$, $O_3$, $H_2O$ or the like, a reduction reaction using an organic acid such as $H_2$, HCOOH, $CH_3COOH$ or the like, or alcohols such as CH$_3$OH, C$_2$H$_5$OH or the like, a carbonization reaction using CH$_4$, C$_2$H$_6$, C$_2$H$_4$, C$_2$H$_2$, and a nitriding reaction using NH$_3$, NH$_2$NH$_2$, N$_2$ or the like.

As the reaction gases, it may be possible to use three kinds of reaction gases or four kinds of reaction gases. For instance, a strontium titanate (SrTiO$_3$) film is formed using three kinds of reaction gases. As the three kinds of reaction gases, it may be possible to use, e.g., Sr(THD)$_2$ (strontium bistetramethylheptanedionate) as a Sr material, Ti(OiPr)$_2$ (THD)$_2$ (titanium bisisopropoxide bistetramethylheptanedionate) as a Ti material, and an ozone gas as an oxidizing gas thereof. In this case, the gases are switched in the order of a Sr source gas, a substituting gas, an oxidizing gas, a substituting gas, a Ti source gas, a substituting gas, an oxidizing gas and a substituting gas.

Examples

Experiment 1

Figure 10:
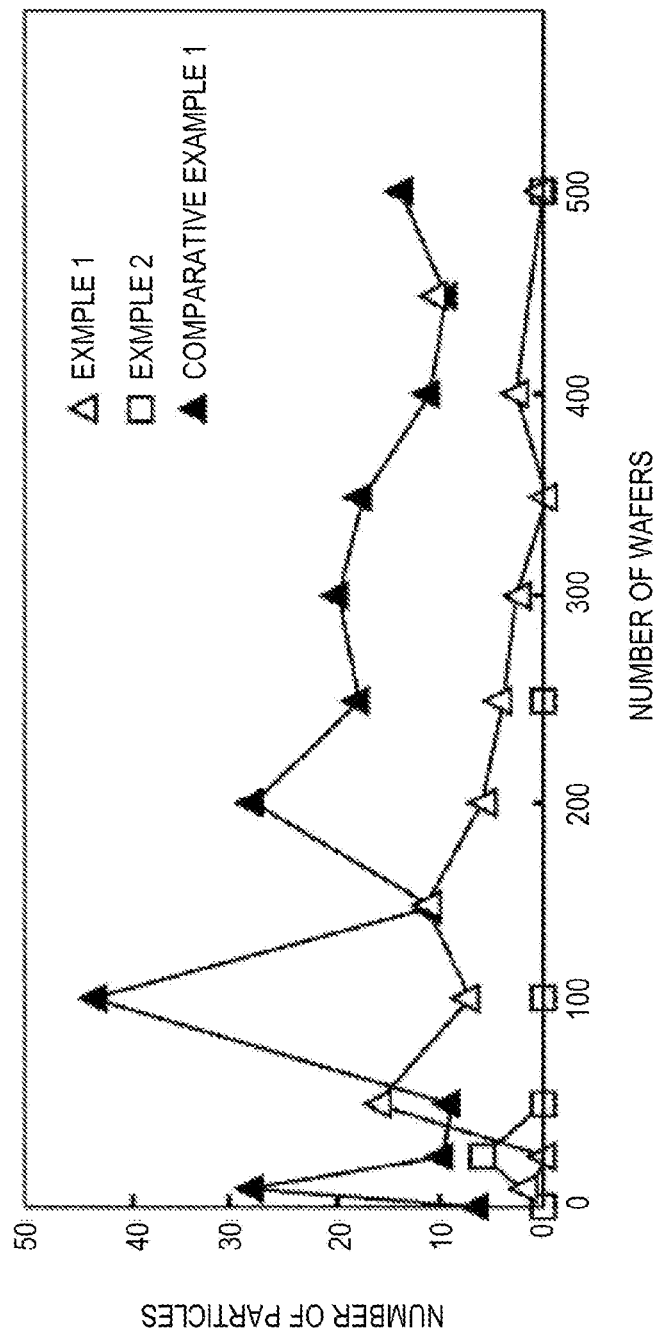
FIG. 10 is a characteristic diagram representing the relationship between the number of processed wafers and the number of particles.

Using the film forming apparatus shown in FIG. 1, a titanium nitride film was formed by supplying a titanium chloride gas and an ammonia gas into the processing space 30. The number of particles adhering to the wafer W was measured. The titanium nitride film was formed under the processing conditions described in the aforementioned film forming process. Each time when 50 wafers are processed, the number of particles adhering to the wafer W and having a size of 0.16 μm or more was measured by a wafer surface inspection device (Surfscan SP2 made by KLA-Tencor Corporation). The results are shown in FIG. 10 in which the horizontal axis indicates the number of processed wafers and the vertical axis denotes the number of particles.

In a film forming apparatus employing a stainless steel-made connecting member 42 and subjected to a cleaning process, the film forming process was performed after the aforementioned purging process. The number of particles adhering to the wafer W at this time is plotted by Δ (example 1). In a film forming apparatus employing a hastelloy-made connecting member 42 and subjected to a cleaning process, the film forming process was performed after the aforementioned purging process. The number of particles adhering to the wafer W at this time is plotted by □ (example 2). The number of particles adhering to the wafer W in case where, instead of the aforementioned purging process, purging is performed by supplying a purge gas into the titanium chloride supply path 52 and the ammonia supply path 53 at flow rates of 200 sccm and 3000 sccm, is plotted by ▲ (comparative example 1). The purging conditions and the cleaning conditions used in examples 1 and 2 are the same as those of the aforementioned embodiment.

As a result, it was recognized that the number of particles in examples 1 and 2 is significantly smaller than the number of particles in comparative example 1. Thus, it was confirmed that the particle contamination of the wafer W can be reduced by implementing the purging process of the present disclosure. In example 2, the number of particles remains very small. Thus, it was recognized that the connecting member 42 made of hastelloy is effective in reducing the number of particles. Presumably, the particle generation mechanism is as follows. One major cause of particle generation resides in that the inner wall of the connecting member 42 is corroded by a highly-corrosive cleaning gas. By performing the purging process, the residues existing in the regions corroded by the cleaning gas are detached and removed from the inner wall of the connecting member 42 by the strong flow of the purge gas. Thus, when performing the film forming process, no residue exists on the inner wall of the connecting member 42, whereby particles conveyed into the processing vessel 1 by the reaction gases are reduced.

In comparative example 1, the purge gas is merely supplied to the titanium chloride supply path 52 and the ammonia supply path 53 at the flow rates of 200 sccm and 3000 sccm, respectively. Therefore, the supply pressure when supplying the purge gas into the processing vessel 1 is lower than the supply pressure when supplying the reaction gases into the processing vessel 1. For that reason, even if the purge gas is circulated through the connecting member 42, the flow of the purge gas is weak. Thus, the residues existing in the regions corroded by the cleaning gas cannot be detached from the inner wall of the connecting member 42. On the other hand, if the reaction gases are allowed to flow after the purging process, the reaction gases are pressurized in the retaining tanks 61 and 62 and then supplied into the processing vessel 1. Therefore, the reaction gases are circulated through the connecting member 42 more strongly than the purge gas. For that reason, the residues existing on the inner wall of the connecting member 42 are detached by the reaction gases and are conveyed to the processing vessel 1 together with the reaction gases. Thus, particles are presumed to increase.

In the present disclosure, a film forming process is performed by sequentially supplying different kinds of mutually-reacting reaction gases to a substrate. Thereafter, particles adhering to the regions which make contact with the reaction gases are removed by the circulation of a purge gas. Using a pressure-increasing retaining unit for first increasing the pressures of the reaction gases and then supplying the reaction gases into a process chamber, the pressure of the purge gas is made higher than the increased pressures of the reaction gases. Thereafter, the purge gas is supplied into the process chamber. Thus, due to the strong flow of the purge gas, particles existing in the flow paths of the downstream side of the retaining units are conveyed and removed together with the purge gas. Accordingly, it is possible to reduce particle contamination of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a thin film by sequentially supplying different kinds of mutually-reacting reaction gases to a substrate held within a process chamber of vacuum atmosphere and depositing reaction products on the substrate, the film forming apparatus comprising:

gas supply paths formed in a corresponding relationship with the different kinds of the mutually-reacting reaction gases, and configured to supply the mutually-reacting reaction gases into the process chamber;

valves installed in the gas supply paths at upstream and downstream sides of retaining units;

a purge gas supply unit configured to supply a purge gas to the retaining units;

the retaining units installed in the gas supply paths, internal pressures of the retaining units being increased by retaining at least one of the mutually-reacting reaction gases and the purge gas; and a control unit configured to control: a film forming process for sequentially performing operations of actuating the valves such that the mutually-reacting reaction gases are retained in the retaining units, the internal pressures of the retaining units are increased to a first pressure and then the mutually-reacting reaction gases are supplied from the retaining units into the process chamber; and a purging process including a degassing operation of evacuating the gas supply paths to remove the mutually-reacting reaction gases remained from the film forming process, a purging operation including performing a purging gas filling action of simultaneously and continuously supplying the purging gas to the retaining units to increase the internal pressures of the retaining units to a second pressure higher than a first pressure, and subsequently performing and repeating a plurality number of times a purging action of actuating the valves to supply the purging gas from the retaining units sequentially and non-simultaneously to the process chamber, and a vacuum operation, performed after the purging action, of evacuating the gas supply paths to remove the purging gas.

2. The apparatus of claim 1, wherein the purge gas supply unit is installed so as to supply the purge gas to the gas supply paths at the upstream side of the retaining units.

3. The apparatus of claim 1, further comprising:

a cleaning fluid supply unit configured to supply a cleaning fluid into the process chamber, wherein the purge gas is supplied to the retaining units after supplying the cleaning fluid into the process chamber and before supplying the mutually-reacting reaction gases to the retaining units.

4. The apparatus of claim 1, wherein the internal pressures of the retaining units generated when the valves existing at the downstream side of the retaining units are closed to increase the internal pressures of the retaining units again by the purge gas after supplying the purge gas into the process chamber from the retaining units whose internal pressures are increased by the purge gas, are set to become 80% to 90% of the internal pressures of the retaining units increased by the purge gas at the time of starting the supply of the purge gas from the retaining units into the process chamber.

5. A gas supply device used in a film forming apparatus for forming a thin film by sequentially supplying different kinds of mutually-reacting reaction gases to a substrate held within a process chamber of vacuum atmosphere and depositing reaction products on the substrate, the gas supply device comprising:

gas supply paths formed in a corresponding relationship with the different kinds of the mutually-reacting reaction gases, and configured to supply the mutually-reacting reaction gases into the process chamber;

valves installed in the gas supply paths at upstream and downstream sides of retaining units;

a purge gas supply unit configured to supply a purge gas to the retaining units;

the retaining units installed in the gas supply paths, an internal pressures of the retaining units being increased by retaining at least one of the mutually-reacting reaction gases and the purge gas; and a control unit configured to control: a film forming process for sequentially performing operations of actuating the valves such that the mutually-reacting reaction gases are retained in the retaining units, the internal pressures of the retaining units are increased to a first pressure and then the mutually-reacting reaction gases are supplied from the retaining units into the process chamber; and a purging process including a degassing operation of evacuating the gas supply paths to remove the mutually-reacting reaction gases remained from the film forming process, a purging operation including performing a purging gas filling action of simultaneously and continuously supplying the purging gas to the retaining units to increase the internal pressures of the retaining units to a second pressure higher than a first pressure, and subsequently performing and repeating a plurality number of times a purging action of actuating the valves to supply the purging gas from the retaining units sequentially and non-simultaneously to the process chamber, and a vacuum operation, performed after the purging action, of evacuating the gas supply paths to remove the purging gas.

\* \* \* \* \*